United States Patent
Lee et al.

[19]

[11] Patent Number: 6,101,656
[45] Date of Patent: Aug. 15, 2000

[54] WAFER CLEANING DEVICE

[75] Inventors: Sen-Nan Lee, Hsinchu; Ying-Chih Liu, Ping Tung Hsien, both of Taiwan

[73] Assignee: Worldwide Semiconductor Manufacturing Corp., Hsinchu, Taiwan

[21] Appl. No.: 09/200,174

[22] Filed: Nov. 25, 1998

[30] Foreign Application Priority Data

Sep. 15, 1998 [TW] Taiwan ................................. 87115308

[51] Int. Cl.⁷ .............................. B08B 3/00; B08B 11/00
[52] U.S. Cl. .................................. 15/102; 15/77
[58] Field of Search .............. 15/77, 88.2, 97.1, 15/102

[56] References Cited

U.S. PATENT DOCUMENTS

| | | | |
|---|---|---|---|
| 5,581,837 | 12/1996 | Uchiyama et al. | 15/102 |
| 5,858,109 | 1/1999 | Hymes et al. | 15/102 |
| 5,868,857 | 2/1999 | Moinpour et al. | 15/102 |
| 5,911,257 | 6/1999 | Morikawa et al. | 15/102 |
| 5,933,902 | 8/1999 | Frey | 15/102 |
| 5,943,725 | 8/1999 | Wandres | 15/102 |

*Primary Examiner*—Terrence R. Till
*Attorney, Agent, or Firm*—J.C. Patents; Jiawei Huang

[57] ABSTRACT

A wafer-cleaning device comprises a looped belt forming an enclosed region and a pair of rollers. Each roller occupies one end inside the enclosed region. Furthermore, a supporting structure located inside the enclosed region not only supports the rollers, but also maintains some tension on the belt. Thus, one portion of the belt is flat. The supporting structure is capable of supporting a wafer as well. In addition, a wafer-rotating device can be installed next to the edge of a wafer so that the wafer can rotate in a prescribed direction while the wafer surface is cleaned.

28 Claims, 2 Drawing Sheets

WAFER CLEANING DEVICE

CROSS-REFERENCE TO RELATED APPLICATION

This application claims the priority benefit of Taiwan application serial no. 87115308, filed Sep. 15, 1998, the full disclosure of which is incorporated herein by reference.

BACKGROUND OF THE INVENTION

1. Field of Invention

The present invention relates to a wafer-cleaning device. More particularly, the present invention relates to a device for cleaning the surface of a silicon wafer after chemical-mechanical polishing (CMP).

2. Description of Related Art

In the process of manufacturing semiconductor devices, silicon wafers are frequently planarized after a particular treatment such as sputtering or deposition. At present, the chemical-mechanical polishing (CMP) method has become one of the most frequently used manufacturing techniques for the global planarization of silicon wafers. However, whenever a silicon wafer is polished, a large quantity of small chips or particles is also produced. Therefore, a post CMP cleaning operation is often required to clear away these unwanted particles from the wafer surface and edge.

A conventional post CMP cleaning operation involves the use of a brush roller or a pen brush. FIGS. 1A and 1B show the respective schematic top and front view of a conventional brush roller type of wafer cleaning device. The top surface of a wafer 10 is cleaned using a brush roller 12. During a wafer cleaning operation, the wafer 10 rotates in the direction A while the brush roller 12 rotates in the direction B (as shown in FIG. 1B). Through the simultaneous movement of the wafer 10 and the brush roller 12, the entire surface of the wafer 10 is ultimately cleaned.

FIGS. 2A and 2B show the respective schematic top and front view of a conventional pen brush type of cleaning device. The top surface of a wafer 10 is cleaned using a pen brush 14. During a wafer cleaning operation, the wafer 10 rotates in the direction A while the pen brush moves horizontally across the wafer in the direction 13 (as shown in FIG. 2B). Through the simultaneous movement of the wafer 10 and the pen brush 14, the entire surface of the wafer 10 is ultimately cleaned.

In general, after the loose chips or particles are scooped up by a brush roller 12 or a pen brush 14, these chips or particles have to be carried away by flowing liquid or chemical agent. Yet, no matter whether a brush roller or a pen brush is used, it is difficult to provide a wafer whose surface maintains a uniform alkalinity/acidity or pH value by conventional techniques. This is because these types of cleaning methods can only provide cleaning in a localized region at any one moment.

In addition, the scooped-up chips or particles will eventually fall back onto the wafer surface due to gravity. As these particles hit the wafer surface, the surface may be scratched or damaged again.

Hence, a brush roller or a pen brush can at best achieve a localized silicon particle removal. For example, a brush roller type can remove a narrow band of particles from the wafer surface at one time, and a pen brush can remove the particles surrounding the pen brush at any one time. In fact, both types of cleaning can be considered cleaning processes achieved through the piece-wise addition of a large number of localized cleaning operations.

Furthermore, since the aforementioned methods clean only a limited region of the silicon wafer at any one time, a longer period is required to clean up the entire wafer surface. Consequently, time is wasted in the cleaning operation.

In light of the foregoing, there is a need to provide a global wafer-cleaning device.

SUMMARY OF THE INVENTION

Accordingly, the present invention provides a wafer-cleaning device that is capable of simultaneously cleaning the entire wafer surface instead of cleaning one localized region at a time.

In another aspect, this invention provides a wafer-cleaning device capable of maintaining a uniform chemical environment so that pH variation across the wafer surface is suppressed.

In yet another aspect, this invention provides a wafer-cleaning device capable of cleaning the entire wafer surface in a single pass, thereby saving some processing time.

To achieve these and other advantages and in accordance with the purpose of the invention, as embodied and broadly described herein, the invention provides a wafer-cleaning device. The device comprises a looped belt forming an enclosed region and a pair of rollers. Each roller occupies one end inside the enclosed region. Furthermore, a supporting structure located inside the enclosed region not only supports the rollers, but also provides some tension to the belt. Thus, a section of the belt is flat. The supporting structure is capable of supporting a wafer as well. In addition, a wafer-rotating device can be installed on the edge of a wafer so that the wafer can rotate in a prescribed direction when the wafer surface is cleaned.

Furthermore, two wafer-cleaning devices can be employed at the same time. One wafer-cleaning device can be used for cleaning the wafer surface, while the other wafer-cleaning device can be used for cleaning the edge of the wafer. Hence, an effective cleaning operation can be carried out.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
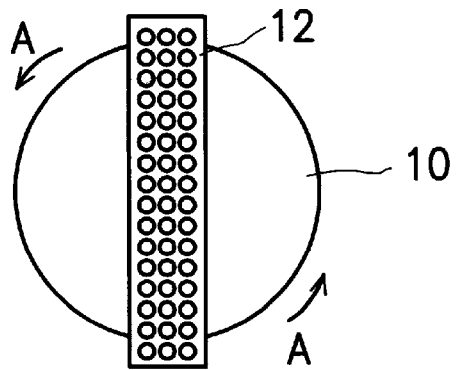
FIG. 1A is a schematic top view showing a conventional brush roller type of water cleaning device.
Figure 1B:
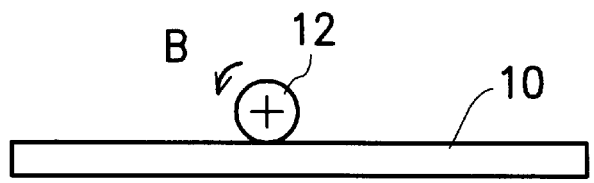
FIG. 1B is a schematic front view showing the conventional brush roller type of wafer cleaning device as shown in FIG. 1A.
Figure 2A:
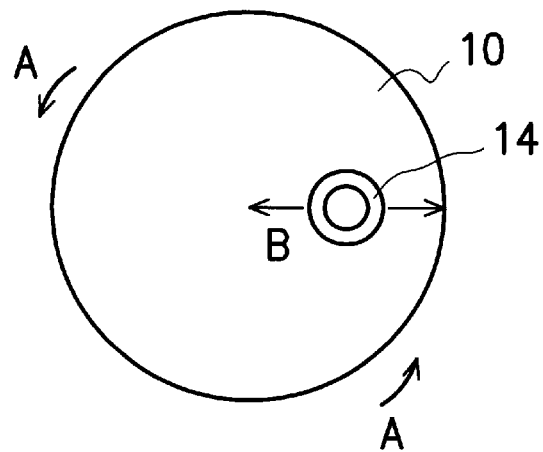
FIG. 2A is a schematic top view showing a conventional pen brush type of wafer cleaning device.
Figure 2B:
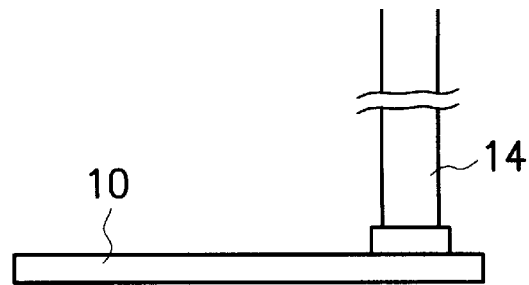
FIG. 2B is a schematic front view showing the conventional pen brush type of wafer cleaning device as shown in FIG. 2A.

Reference will now be made in detail to the present preferred embodiments of the invention, examples of which are illustrated in the accompanying drawings. Wherever possible, the same reference numbers are used in the drawings and the description to refer to the same or like parts.

This invention provides a wafer-cleaning device suitable for a post-CMP cleaning operation. Through this wafer-cleaning device, the surface and edge of a silicon wafer can be cleaned globally and rapidly. In fact, the wafer-cleaning device can be used not just for post-CMP cleaning, but also for any wafer-cleaning operation.

Figure 3:
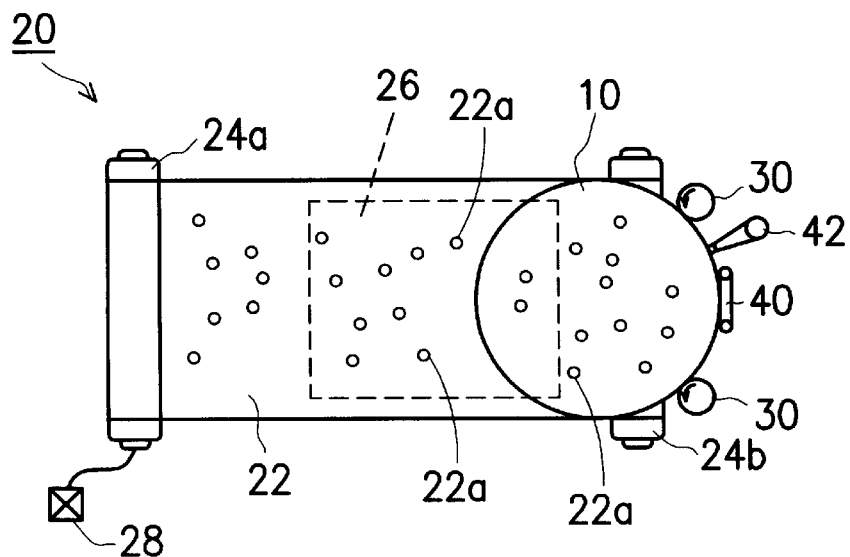
FIG. 3 is a schematic top view showing a wafer-cleaning device according to the preferred embodiment of this invention.
Figure 4:
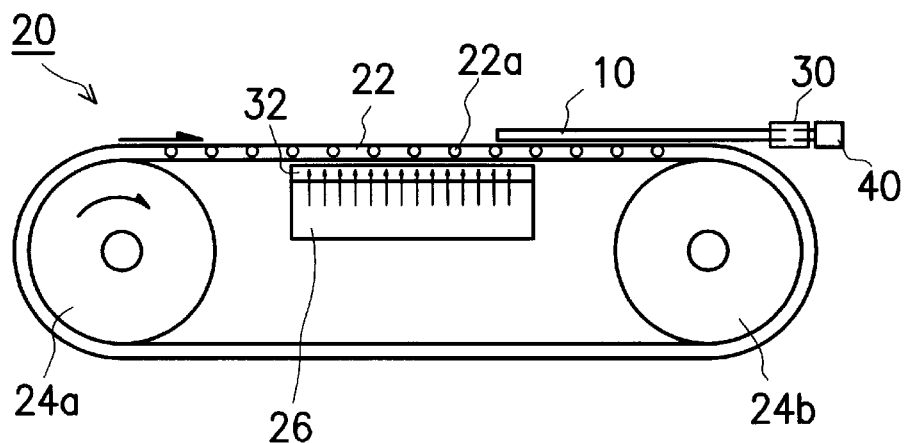
FIG. 4 is a schematic front view showing the wafer-cleaning device as shown in FIG. 3.

FIG. 3 is a schematic top view showing a wafer-cleaning device according to the preferred embodiment of this invention; and FIG. 4 is a schematic front view showing the wafer-cleaning device as shown in FIG. 3.

The wafer-cleaning device 20 of this invention includes a belt 22 and a pair of rollers 24a/24b. The belt 22 wraps around the rollers 24a/24b to form an enclosed region. The rollers 24a/24b are mounted to the ends of a central frame (not shown) that maintains tension in the belt 22. Hence, a flat section is formed by the upper and lower part of the belt. The belt 22 is made from a liquid-permeable material such as polyvinyl alcohol (PVA), polyurethane (PU) or other material having similar properties. Furthermore, the surface of the belt 22 is etched to form special protruding or trench patterns 22a.

These patterns 22a on the belt 22 surface provide a rough surface capable of scraping off loose chips and particles from the surface of wafer 10. The width of the belt 22 must be at least slightly wider than the diameter of the silicon wafer 10. Moreover, when the cleaning-device is used, the wafer 10 must be mounted so that it is in contact with the upper surface of the flat region of the belt 22.

The rollers 24a/24b are coupled to a driving device 28. The driving device 28 is capable of making the rollers 24a/24b rotate in a prescribed direction so that the belt 22 is driven into motion in the direction as indicated.

Within the enclosed region formed by the belt 22, a supporting frame 26 can be installed to support the wafer 10 so that the belt 22 does not sag when the wafer 10 is pressed onto the belt 22. A set of subsidiary devices 30 can also be installed on the edge of the water 10 to rotate the wafer 10 in a prescribed direction.

Before the wafer-cleaning operation starts, the wafer 10 is first mounted with its front surface facing the belt 22 so that the wafer surface and the belt surface are touching each other. The wafer 10 should have at least three fourths of its surface in contact with the surface of the belt 22. As the rollers 24a/24b rotate, the flat section of the belt 22 moves horizontally across the face of the wafer.

Therefore, rough particles, trenches or protruding patterns 22a on the surface of belt 22 continuously scrape off loose chips or silicon particles stuck on the wafer surface. Since the belt 22 has a large contact area with the wafer 10, a very large surface area can be cleaned in a single pass of the belt. Hence, the cleaning action is uniform and the cleaning operation can be finished quickly. Furthermore, the front surface of wafer 10 is mounted upside down with respect to the belt 22. Because of this positioning, gravity causes scraped-off chips or particles to remain on the belt 22, instead of falling back to the surface of the wafer and causing secondary damage to the wafer surface, as occurs in the conventional cleaning process.

During the cleaning process, chemical reagents can be injected onto the surface between the belt 22 and the wafer through a special injector 32. The injector 32 can be mounted on top of a supporting device 26. Since the contact area between the belt 22 and the wafer surface is large, the pH value across the wafer surface can be better controlled so that subsequent processing operations can be carried out without complications.

In addition, a set of wafer-rotating device 30 (as shown in FIGS. 3 and 4) attached to the edge of a wafer may be added to rotate the wafer 10 in a prescribed direction. Through the horizontal movement of the belt 22 and the rotation of the wafer 10, the entire wafer surface is cleaned all at once.

The aforementioned installations are used mainly for cleaning the front surface of a wafer. However, if the edge of a wafer needs to be cleaned as well, another set of cleaning device 40 having similar construction can be added. The belt of the cleaning device 40 is mounted in contact with the edge of the wafer 10 so that any loose chips or particles attached to the edge of the wafer 10 can be removed as the belt rotates. Furthermore, another injector 42 can be installed facing the edge of the wafer 10 for sending out a jet of de-ionized water, which serves to wash away the scooped-up particles.

In summary, the wafer-cleaning device of this invention is capable of globally cleaning a silicon wafer. The large contact area between the wafer surface and the belt provide a uniform pH across the entire wafer surface, saving time due to the large cleaning surface provided by the device. Moreover, scraped-off particles or chips will not fall back onto the wafer surface due to gravity to cause secondary damages.

Although the device is used to clean a wafer after a CMP operation, application of the device should not be restricted as such. In fact, the wafer-cleaning device can be used to clean silicon wafers after any semiconductor processing operations.

Hence, one characteristic of this invention is that the device of this invention is capable of globally rather than locally cleaning a wafer. Moreover, a uniform distribution of pH can be maintained across the entire wafer surface. The second characteristic of this invention is that the wafer is mounted with its front surface facing down and touching the belt. Therefore, gravity makes the scraped-off particles fall back onto the belt surface instead of falling back onto the wafer to cause secondary damages. One further characteristic of this invention is that both the wafer surface and wafer edge can be cleaned at the same time. Hence, processing time and production cost are saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer-cleaning device, comprising:
    a looped belt forming an enclosed region;
    a pair of rollers inside the enclosed region providing some tension to the belt so that the belt has a flat section, wherein the flat section is used for cleaning the surface of a wafer in a horizontal manner;
    a supporting structure inside the enclosed region capable of supporting the wafer; and
    a wafer-rotating device mounted next to the edge of the wafer so that the wafer can rotate in a prescribed direction upon the flat section of the looped belt, wherein the entire surface of the wafer is cleaned all at once by rotating the wafer using the wafer-rotating device.

2. The device of claim 1, wherein width of the belt is the same or greater than the diameter of the wafer.

3. The device of claim 1, wherein the surface of the belt includes a pattern of trenches.

4. The device of claim 1, wherein the belt itself is liquid permeable.

5. The device of claim 4, wherein the belt is formed from a material that includes polyvinyl alcohol (PVA).

6. The device of claim 4, wherein the belt is formed from a material that includes polyurethane (PU).

7. The device of claim 1, wherein the device further includes a chemical injector for spraying a chemical agent onto the belt.

8. The device of claim 7, wherein the chemical injector is mounted on the surface of the supporting structure so that the chemical agent can be sprayed onto the underside of the belt surface and reach the upper side of the belt because the belt is liquid-permeable.

9. The device of claim 1, wherein the device further includes a first driving mechanism attached to the rollers for initiating its rotation.

10. The device of claim 1, wherein the device further includes a second driving mechanism attached to the wafer-rotating device for initiating the rotation of wafer.

11. The wafer-cleaning device of claim 1, wherein the upper surface of the wafer is contact with the looped belt.

12. A wafer-cleaning device, comprising:
a looped belt forming an enclosed region;
a pair of rollers inside the enclosed region providing some tension to the belt so that the belt has a flat section, wherein the flat section is used for cleaning the surface of a wafer in a horizontal manner; and
a supporting structure inside the enclosed region capable of supporting the wafer.

13. The device of claim 12, wherein width of the belt is the same or greater than the diameter of the wafer.

14. The device of claim 12, wherein the surface of the belt includes a pattern of trenches.

15. The device of claim 12, wherein the belt itself is liquid-permeable.

16. The device of claim 15, wherein the belt is formed from a material that includes polyvinyl alcohol (PVA).

17. The device of claim 15, wherein the belt is formed from a material that includes polyurethane (PU).

18. The device of claim 12, wherein the device further includes a chemical injector for spraying a chemical agent onto the belt.

19. The device of claim 18, wherein the chemical injector is mounted on the surface of the supporting structure so that the chemical agent can spray onto the underside of the belt surface and reach the upper side of the belt because the belt is liquid-permeable.

20. The wafer-cleaning device of claim 12, wherein the upper surface of the wafer is contact with the looped belt.

21. The wafer-cleaning device of claim 12, wherein the upper surface of the wafer is contact with the looped belt.

22. A wafer-cleaning system for cleaning a surface and an edge of a wafer, comprising:
a belt-type cleaning device mounted in contact with the surface of the wafer for cleaning the surface of the wafer, wherein the belt-type cleaning device includes:
a looped belt forming an enclosed region;
a pair of rollers inside the enclosed region providing some tension to the belt so that the belt has a flat section, wherein the flat section is used for cleaning the surface of a wafer in a horizontal manner; and
a supporting structure inside the enclosed region that is capable of supporting the wafer; and
a second cleaning device attached to the edge of the wafer for cleaning the wafer edge.

23. The system of claim 22, wherein the second cleaning device has a structure similar to that of the belt-type cleaning device.

24. The system of claim 22, wherein the belt itself is liquid-permeable.

25. The system of claim 22, wherein the belt-type device further includes a chemical injector for spraying a chemical agent onto the belt.

26. The system of claim 25, wherein the chemical injector is mounted on the surface of the supporting structure so that the chemical agent can spray onto the underside of the belt surface and reach the upper side of the belt because the belt is liquid-permeable.

27. The system of claim 22, wherein the second cleaning device further includes a water injector for injecting de-ionized water onto the edge of the wafer.

28. The system of claim 22, wherein the cleaning device further includes a wafer-rotating device attached to the edge of a wafer for rotating the wafer in a prescribed direction.

* * * * *